United States Patent
Pong et al.

(10) Patent No.: US 6,835,624 B2
(45) Date of Patent: Dec. 28, 2004

(54) SEMICONDUCTOR DEVICE FOR PROTECTING ELECTROSTATIC DISCHARGE AND METHOD OF FABRICATING THE SAME

(75) Inventors: Won-Hyung Pong, Suwon (KR); Hyung-Rae Park, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/384,833

(22) Filed: Mar. 10, 2003

(65) Prior Publication Data

US 2004/0038485 A1 Feb. 26, 2004

(30) Foreign Application Priority Data

Mar. 11, 2002 (KR) .................. 10-2002-0012953

(51) Int. Cl.[7] ......................................... H01L 21/8238
(52) U.S. Cl. ..................... 438/286; 438/305; 438/306; 257/336; 257/344; 257/408
(58) Field of Search ................................. 257/336, 344, 257/408, E29.012, E29.278, E29.279, E21.435; 438/305, 306, FOR 188, 286, FOR 175, FOR 190

(56) References Cited

U.S. PATENT DOCUMENTS

| | | | | |
|---|---|---|---|---|
| 5,386,134 A | | 1/1995 | Huang ......................... | 257/360 |
| 5,591,661 A | * | 1/1997 | Shiota ......................... | 438/200 |
| 5,793,085 A | * | 8/1998 | Vajana et al. ................ | 257/370 |
| 6,030,864 A | * | 2/2000 | Appel et al. ................. | 438/234 |
| 6,072,216 A | * | 6/2000 | Williams et al. ............. | 257/339 |
| 6,218,226 B1 | * | 4/2001 | Lin et al. ..................... | 438/200 |
| 6,274,443 B1 | * | 8/2001 | Yu et al. ...................... | 438/299 |
| 6,278,162 B1 | * | 8/2001 | Lien et al. ................... | 257/408 |
| 6,350,639 B1 | * | 2/2002 | Yu et al. ...................... | 438/199 |
| 6,353,245 B1 | * | 3/2002 | Unnikrishnan .............. | 257/347 |
| 6,680,493 B1 | * | 1/2004 | Wolf et al. ................... | 257/173 |
| 2002/0185682 A1 | * | 12/2002 | Nandakumar et al. ...... | 257/344 |

\* cited by examiner

*Primary Examiner*—George Fourson
*Assistant Examiner*—Joannie Adelle Garcia
(74) *Attorney, Agent, or Firm*—Miles & Onello, LLP

(57) ABSTRACT

In a semiconductor device for protecting an electrostatic discharge and a method of fabricating the same, a gate electrode is disposed on a semiconductor substrate of first conductivity type, and a heavily doped region and a vertical lightly doped region surround the heavily doped region. The heavily doped region and vertical lightly doped region have a second conductivity type and are disposed in the semiconductor substrate on both sides of the gate electrode. The vertical lightly doped region has a lower impurity concentration and a larger depth than the heavily doped regions. A horizontal lightly doped region, which has a lower impurity concentration than the vertical lightly doped region, is further disposed in an upper side of the vertical lightly doped region. The method comprises forming a gate electrode on a semiconductor substrate of first conductivity type, forming a heavily doped region of second conductivity type in the semiconductor substrate beside the gate electrode, and forming a vertical lightly doped region of second conductivity type surrounding the heavily doped region. The vertical lightly doped region is formed to have a lower impurity concentration and a larger depth than the heavily doped region.

17 Claims, 13 Drawing Sheets

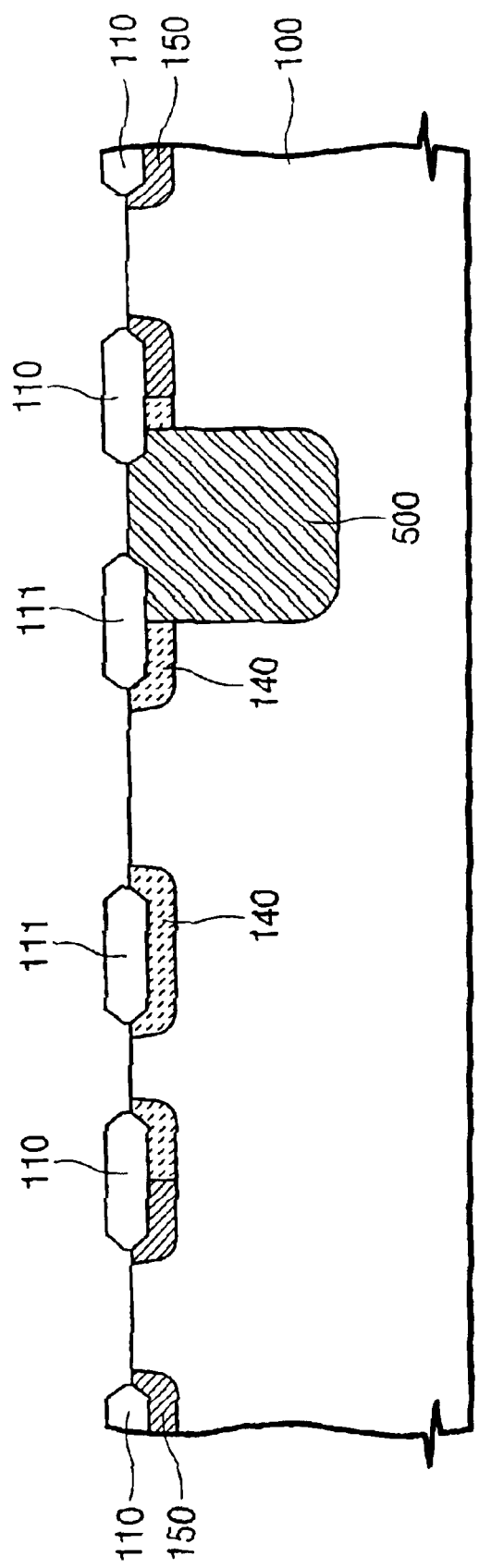

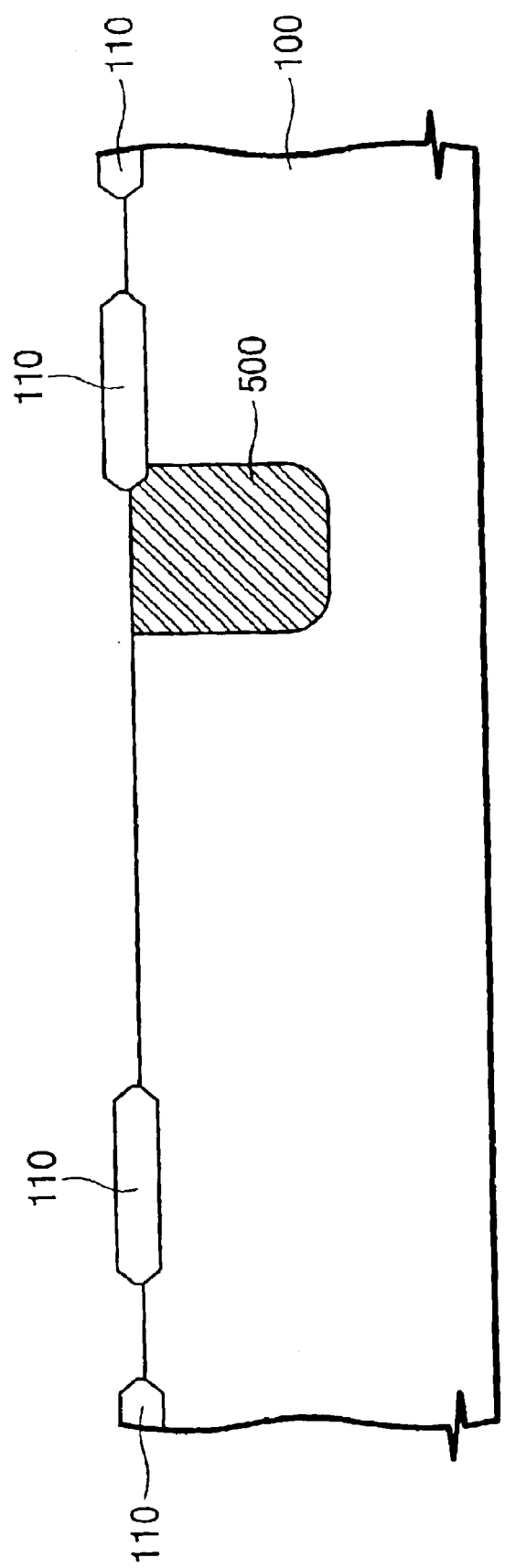

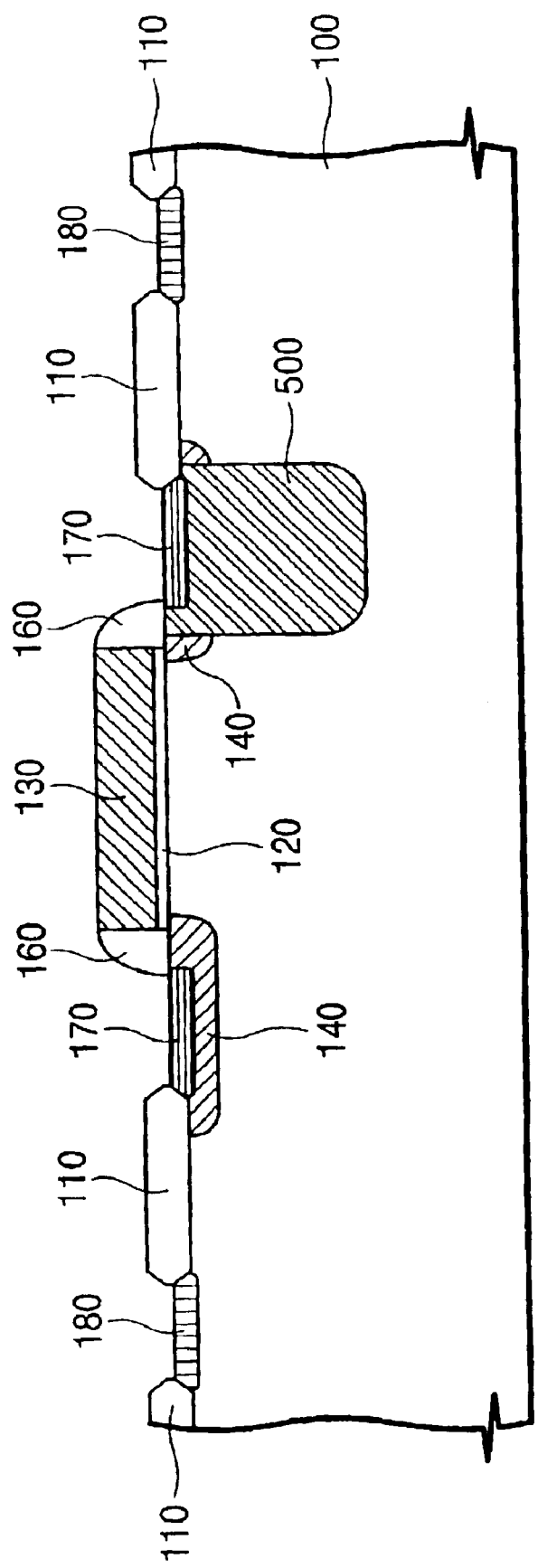

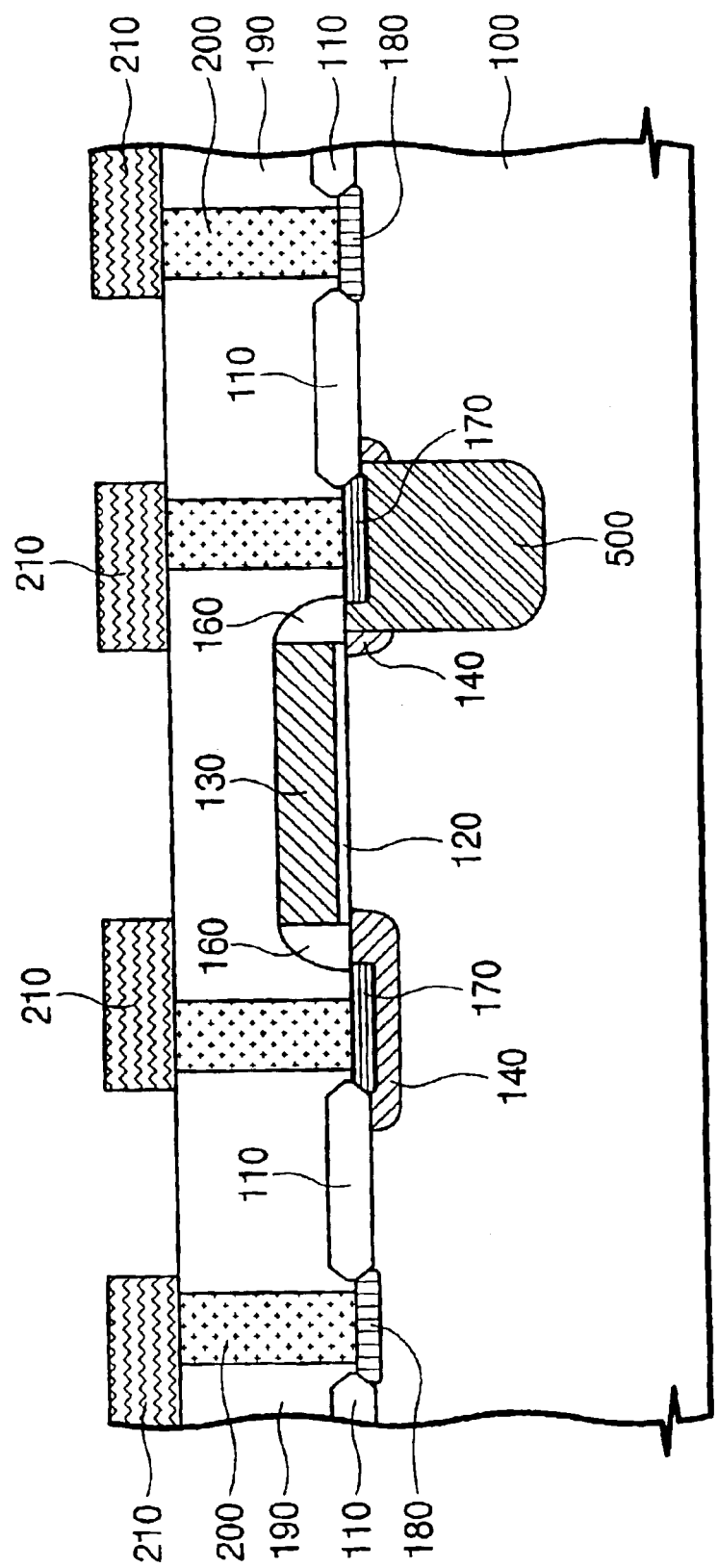

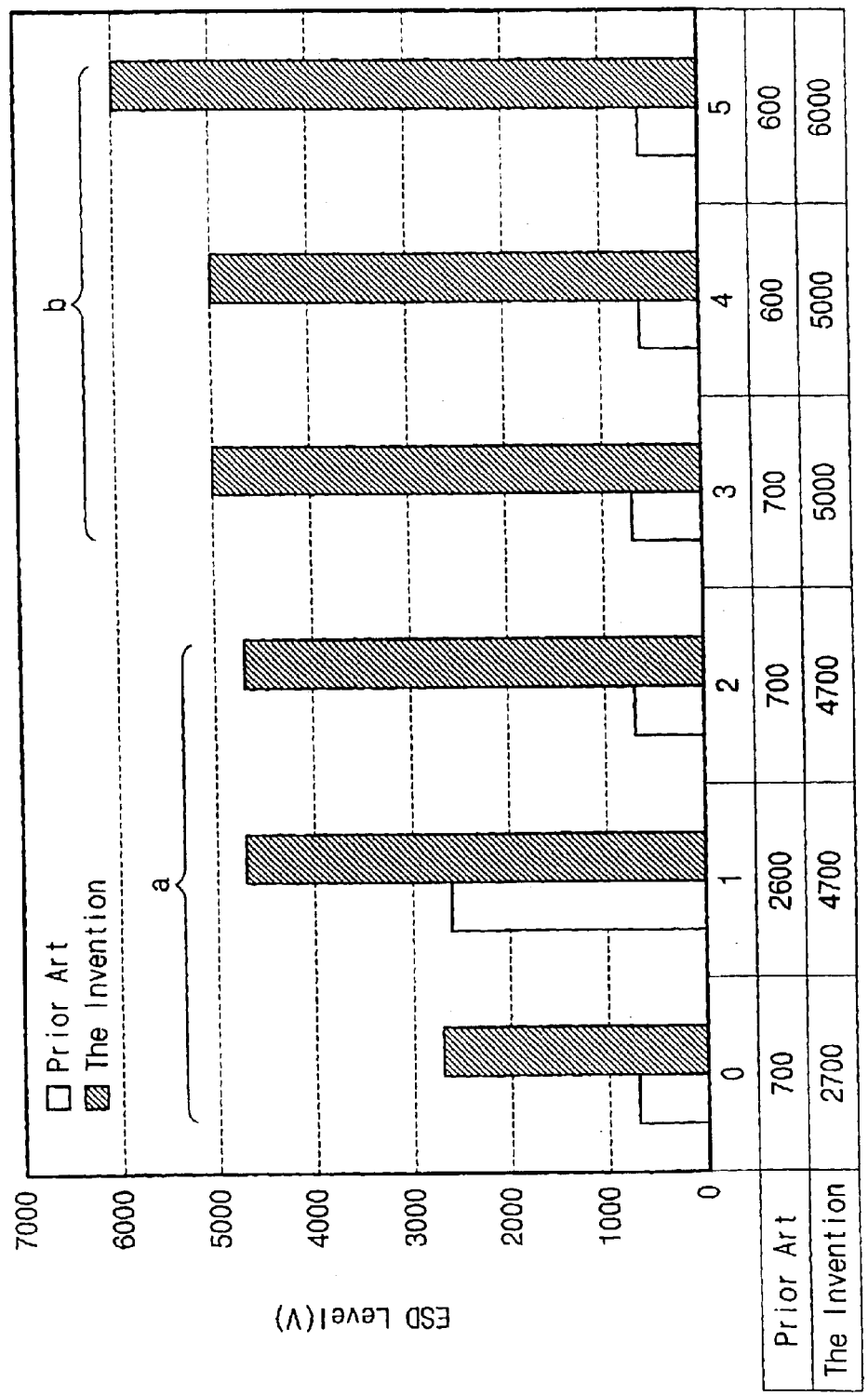

SEMICONDUCTOR DEVICE FOR PROTECTING ELECTROSTATIC DISCHARGE AND METHOD OF FABRICATING THE SAME

RELATED APPLICATION

This application relies for priority upon Korean Patent Application No. 2002-12953, filed on Mar. 11, 2002, the contents of which are herein incorporated by reference in their entirety.

FIELD OF THE INVENTION

The present invention relates to a semiconductor device and a method of fabricating the same, and more particularly to a semiconductor device for minimizing damage caused by electrostatic discharge and a method of fabricating the same.

BACKGROUND OF THE INVENTION

Contemporary semiconductor devices constructed of metal-oxide-semiconductor (MOS) transistors are commonly designed to operate at an internal voltage of about 5 volts. When a semiconductor device including such MOS transistors is manually handled or is mounted to an apparatus, static electricity charge existing in the human body or apparatus may inadvertently be applied to the semiconductor device. The human body may discharge an electrostatic voltage at approximately 2000 volts, or, under certain circumstances, more than several tens of thousands of volts. When the ground state of a semiconductor manufacturing apparatus is unstable, the static electricity discharged from the apparatus may be applied to a semiconductor device mounted thereto, causing a large amount of current to flow through the semiconductor device.

If a high-voltage static electricity is applied to a semiconductor device, the MOS transistors may suffer from gate oxide breakdown or junction spiking. These phenomena may cause complete destruction or minute damage to the device, thus diminishing the reliability of the semiconductor device.

To prevent such an electrostatic damage, a circuit for protecting static electricity should be provided along with the functioning circuit. FIG. 1 is a circuit configuration diagram illustrating a typical circuit for protecting a semiconductor chip from an electrostatic discharge pulse at an input pin.

Referring to FIG. 1, a resistor 16 is disposed between an input pin 12 and a functioning circuit 20. A protection device 18 is disposed between the resistor 16 and the input pin 12. Another terminal of the protection device 18 is coupled to a voltage reference pin 14.

Generally, the protection device 18 comprises a transistor having a threshold voltage that is higher than the operation voltage of the functioning circuit 20. For this, the protection device 18 is preferably a field transistor that is connected to the input pin 12 and has a gate and source, and may further comprise a thyristor.

In the event that a high voltage is applied to the input pin 12, the protection device 18 is turned on and a voltage drop occurs at the resistor 16. Thus, the high voltage applied to the input pin 12 may be dissipated through a current path connecting the protection device 18 and the voltage reference pin 14. However, when the voltage applied to the input pin 12 is higher than the voltage level that the protection device 18 is capable of dissipating, the voltage of the input pin 12 may be additionally applied to the functioning circuit 20, which could be catastrophic to the circuit 20. As described above, under these circumstances, although a voltage drop occurs at the resistor 16, the functioning circuit 20 may be attacked.

FIG. 2 is a cross-sectional view illustrating a configuration of a conventional high-voltage transistor formed in the functioning circuit 20 of FIG. 1.

Referring to FIG. 2, a device isolation layer 32 is disposed at a semiconductor substrate 30 of first conductivity type to define an active region. A gate electrode 34 is disposed on the active region and a gate spacer 36 is disposed on sidewalls of the gate electrode 34.

A lightly doped region 38 of a second conductivity type is disposed in the semiconductor substrate 30 beside the gate electrode 34. The lightly doped region 38 may be extended to a lower portion of an edge of the gate electrode 34. A heavily doped region 40 of second conductivity type is disposed in the semiconductor substrate 30 beside the gate spacer 36. At this time, the heavily doped region 40 has a higher concentration and a shallower diffusion depth than the lightly doped region 38. Thus, the heavily and lightly doped regions 40 and 38 constitute a PN junction together with the semiconductor substrate 30. Also, substrate pick-up regions 42 and 44 of first conductivity type are disposed outside the lightly doped region 38 in the semiconductor substrate 30.

An interlayer dielectric (ILD) 46 is disposed on the semiconductor substrate 30 to cover the gate electrode 34 and the gate spacer 36. A contact plug 48, which penetrates the ILD 46 to connect with the heavily doped region 40 and the substrate pick-up regions 42 and 44, is disposed in the ILD 46. An interconnection 50 is disposed on the ILD 46 to connect with the contact plug 48. At this time, the contact plug 48 and the interconnection 50 are normally composed of aluminum.

As explained above with reference to FIG. 1, high voltage due to the static electricity diffused by the protection device 18 may, under certain circumstances, be additionally applied to the functioning circuit 20. Such a high voltage is transferred to the heavily and lightly doped regions 40 and 38 through the interconnection 50 and the contact plug 48. The high voltage may cause a breakdown in the PN junction formed of the lightly and heavily doped regions 38 and 40. Meanwhile, if there is such a breakdown, high-temperature heat is generated at the interface of the PN junction. However, the conventional lightly doped region 38 is too shallow to delay conduction of the high-temperature heat generated at the interface of the contact plug 48. Thus, in the case where the contact plug 48 is composed of aluminum, a material that has a relatively low melting point, the contact plug 48 can melt, which can have catastrophic effect on the product.

SUMMARY OF THE INVENTION

It is therefore a feature of the present invention to provide a semiconductor device having a junction region that is structured to mitigate melting of a contact plug due to heat caused by electrostatic discharge.

It is another feature of the present invention to provide a method of fabricating a semiconductor device capable of minimizing degradation of product caused by an electrostatic discharge.

The feature of the present invention can be achieved by a semiconductor device comprising a vertical lightly doped region that increases the effective depth of a junction region connected to an input pin. The device comprises a gate electrode disposed on a semiconductor substrate of a first conductivity type, and a heavily doped region and a vertical lightly doped region, which are formed in the semiconductor substrate on both sides of the gate electrode and are of a second conductivity type. At this time, the vertical lightly doped region has a lower impurity concentration and a greater depth than the heavily doped region.

The vertical lightly doped region surrounds at least one heavily doped region. That is, a junction region where the vertical lightly doped region is formed is connected to an input pin where a high voltage caused by an electrostatic discharge is applied.

Preferably, a horizontal lightly doped region is further disposed at an upper side of the vertical lightly doped region. Here, the horizontal lightly doped region has a lower impurity concentration than the vertical lightly doped region. Also, a gate insulation pattern is further disposed between the gate electrode and the semiconductor substrate, and an insulation pattern may be further disposed between the heavily doped region and an edge of the gate electrode.

Another feature of the present invention can be achieved by a method of fabricating a semiconductor device comprising forming a vertical lightly doped region that increases a depth of a junction region. The method comprises forming a gate electrode on a semiconductor substrate of a first conductivity type. A heavily doped region of second conductivity type is then formed in the semiconductor substrate on sides of the gate electrode. A vertical lightly doped region of a second conductivity type is formed in the semiconductor substrate to surround the heavily doped region. At this time, the vertical lightly doped region is formed to a lower impurity concentration and to a greater depth as compared to the heavily doped region.

It is preferable that forming the vertical lightly doped region is followed by forming the gate electrode. However, the vertical lightly doped region may be formed after forming the heavily doped region.

Forming the heavily doped region preferably uses a spacer as an ion implantation mask.

Preferably, before forming the gate electrode, a horizontal lightly doped region is additionally formed. The horizontal lightly doped region is disposed on upper sidewalls of the vertical lightly doped region and contains impurity ions of the second conductivity type. At this time, it is preferable that the horizontal lightly doped region has a lower impurity concentration than the vertical lightly doped region.

In addition, before forming the gate electrode, a device isolation layer is further formed at a predetermined region of the semiconductor substrate to define an active region. While the device isolation layer is formed, an insulation pattern may be formed between an edge of the gate electrode and the heavily doped region.

Meanwhile, before forming the device isolation layer, a horizontal lightly doped region, which is disposed on upper sidewalls of the vertical lightly doped region and comprises impurity ions of the second conductivity type, may be formed. At this time, the horizontal lightly doped region is formed to have a lower impurity concentration than the vertical lightly doped region.

BRIEF DESCRIPTION OF THE DRAWINGS

The above objects and advantages of the present invention will become more apparent by describing in detail preferred embodiments thereof with reference to the attached drawings in which:

FIGS. 5A through 5D are cross-sectional views illustrating a method of fabricating the semiconductor device according to the first preferred embodiment of the present invention.

FIGS. 6A through 6D are cross-sectional views illustrating a method of fabricating the semiconductor device according to the second preferred embodiment of the present invention.

FIG. 7 is an experimental graph showing comparisons in ESD level characteristics between the conventional semiconductor device and the semiconductor device according to the first and second preferred embodiments of the present invention.

DETAILED DESCRIPTION OF PREFERRED EMBODIMENTS

Figure 1:
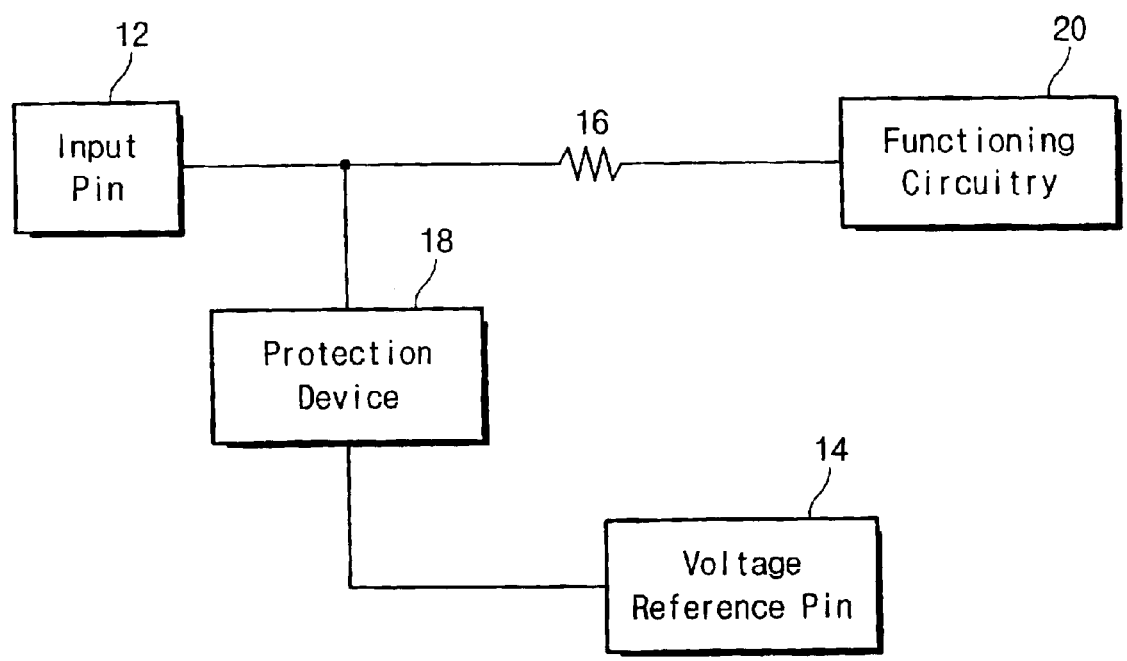
FIG. 1 is a circuit configuration diagram illustrating a typical circuit for protecting a semiconductor chip from an electrostatic discharge pulse at an input pin.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3:
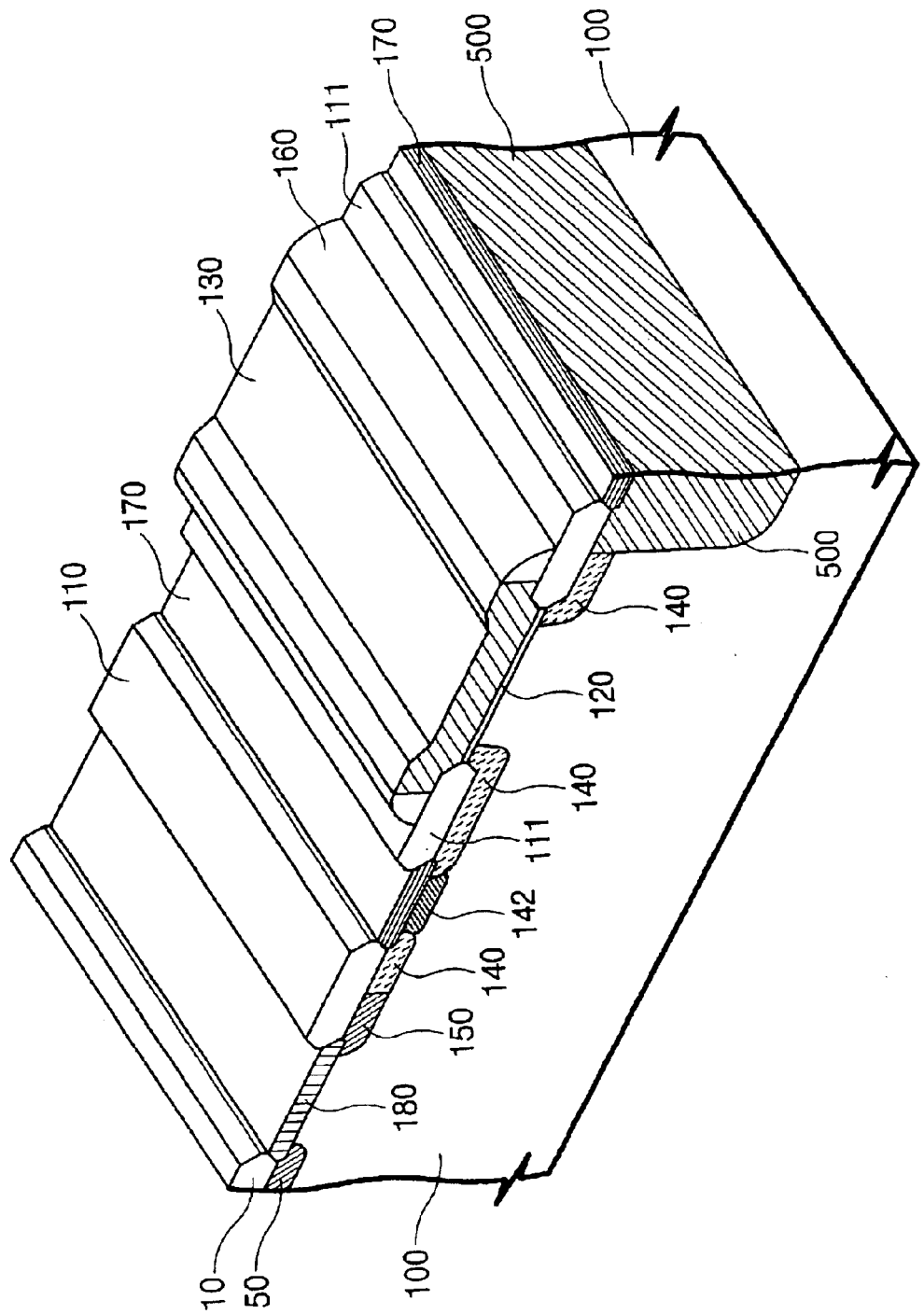
FIG. 3 is a perspective view illustrating a semiconductor device according to a first preferred embodiment of the present invention.

FIG. 3 is a perspective view illustrating a high-voltage transistor provided in a functioning circuit, such as the functioning circuit 20 of FIG. 1.

Referring to FIG. 3, a device isolation layer 110 is disposed at a predetermined region of a semiconductor substrate 100 to define an active region. At this time, the semiconductor substrate 100 contains impurities of first conductive type. A gate electrode 130 is disposed on the active region and a gate spacer 160 is disposed on sidewalls of the gate electrode 130. A gate insulation pattern 120 is disposed between the gate electrode 130 and the semiconductor substrate 100. The gate insulation pattern 120 is preferably in the form of a silicon oxide layer.

An insulation pattern 111 is disposed between the semiconductor substrate 100 and an edge of the gate electrode 130. It is preferable that the insulation pattern 111 has the same thickness and depth as the device isolation layer 110. Also, the insulation pattern 111 is preferably formed at edges on both sides of the gate electrode 130.

A lightly doped pickup region 150 is disposed under the device isolation layer 110, and a horizontal lightly doped region 140 is disposed under the insulation pattern 111. A heavily doped region 170 is disposed in the semiconductor substrate 100 between the insulation pattern 111 and the device isolation layer 110. At this time, the horizontal lightly doped region 140 may be disposed under the device isolation layer 110. Thus, the horizontal lightly doped region 140 and the lightly doped pickup region 150 are in contact with each other and disposed under the device isolation layer 110 adjacent to the heavily doped region 170.

A substrate pickup region 180 for applying a voltage to the semiconductor substrate 100 is disposed in the semiconductor substrate 100 between the lightly doped pickup regions 150. At this time, the substrate pickup region 180 and the lightly doped pickup region 150 include impurities of the same first conductivity type as the semiconductor substrate 100. Also, the substrate pickup region 180 includes impurities of higher concentration than the lightly doped pickup region 150.

Meanwhile, a lower lightly doped region 142 may be disposed under the heavily doped region 170 between the horizontal lightly doped regions 140. At this time, the heavily doped region 170, the horizontal lightly doped region 140, and the lower lightly doped region 142 include impurities of second conductivity type. The lower lightly doped region 142 includes impurities of higher concentration than the horizontal lightly doped region 140 and of lower concentration than the heavily doped region 170. Thus, the horizontal lightly doped region 140 and the lightly doped pickup region 150, which are in contact with each other, constitute a PN junction. The heavily doped region 170 is disposed on both sides of the gate electrode 130 to form a source/drain of the transistor.

A vertical lightly doped region 500, which surrounds the heavily doped region 170, is disposed in the semiconductor substrate 100 between the insulation pattern 111 and the device isolation layer 110. The vertical lightly doped region 500 includes impurities of second conductivity type, whose concentration is lower than the heavily doped region 170 and higher than the horizontal lightly doped region 140. Also, the vertical lightly doped region 500 has a narrower width than the horizontal lightly doped region 140 and a wider width than the heavily doped region 170. Further, the vertical lightly doped region 500 has a deeper diffusion depth than the two regions 140 and 170. Thus, the horizontal lightly doped region 140 is disposed beside an upper portion of the vertical lightly doped region 500. Preferably, the vertical lightly doped region 500 has the same depth and impurity concentration as a well region (not shown) formed at a predetermined region of the semiconductor substrate 100.

The vertical lightly doped region 500, as illustrated in FIG. 3, is preferably disposed under the heavily doped region 170 to be used as a drain of the transistor. However, the vertical lightly doped region 500 may be disposed under the heavily doped region 170 to be used as a source (not shown).

Figure 2:
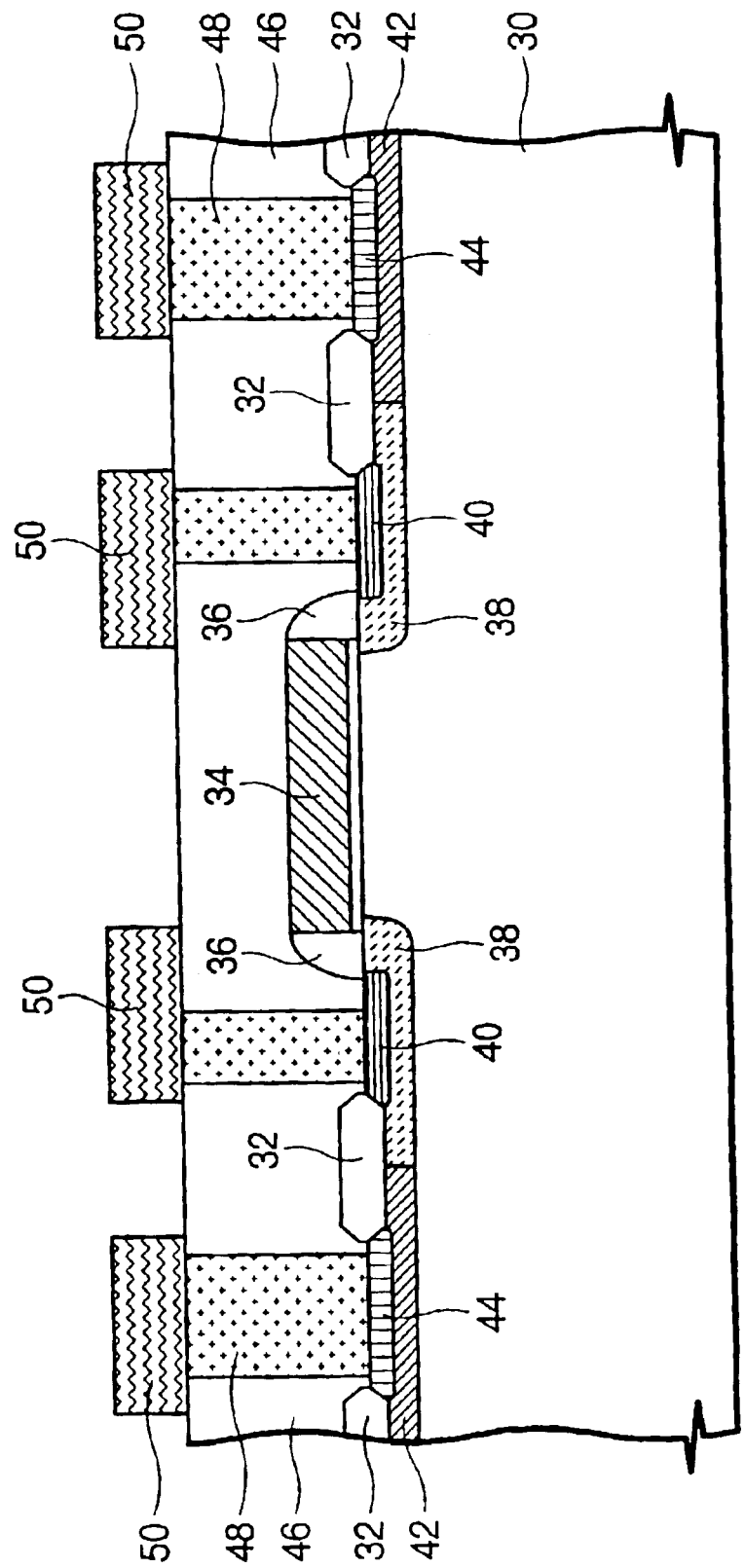
FIG. 2 is a cross-sectional view illustrating a configuration of a conventional high-voltage transistor connected to an input pin.
Figure 4:
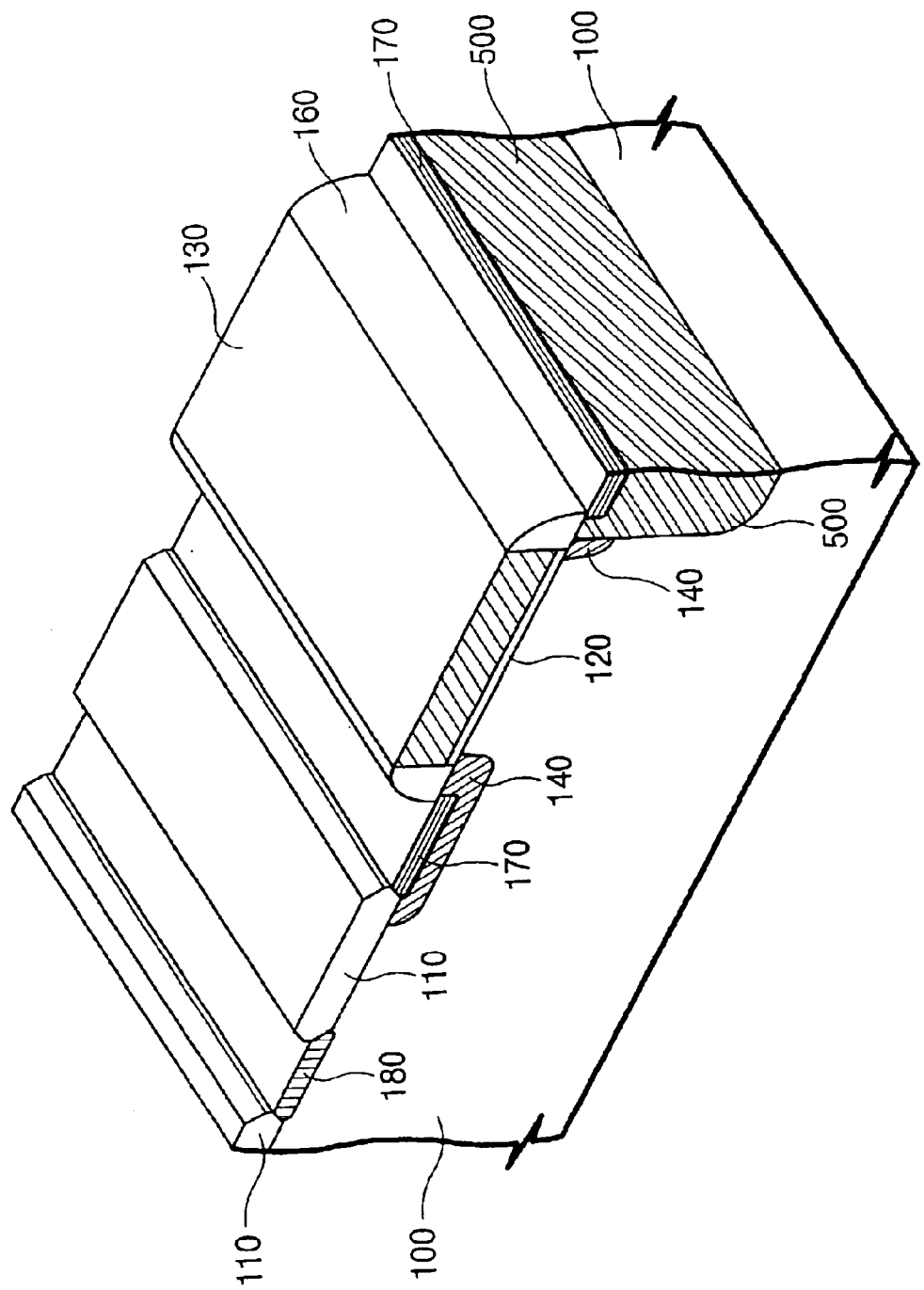
FIG. 4 is a perspective view illustrating a semiconductor device according to a second preferred embodiment of the present invention.

FIG. 4 is a perspective view illustrating a high-voltage transistor included in a functioning circuit, such as the functioning circuit 200 of FIG. 2, according to a second preferred embodiment of the present invention. The features of the second embodiment that are the same as the first embodiment will be omitted here for brevity. The same reference numerals in FIGS. 3 and 4 represent the same elements.

Referring to FIG. 4, a device isolation layer 110 is disposed at a predetermined region of a semiconductor substrate 100 to define an active region. A gate electrode 130 is disposed on the active region. A gate spacer 160 is disposed on sidewalls of the gate electrode 130. A gate insulation pattern 120 is disposed between the gate electrode 130 and the semiconductor substrate 100. As illustrated in FIG. 3, a substrate pickup region 180 for applying a voltage to the semiconductor substrate 100 is disposed in the semiconductor substrate 100 between the device isolation layers 110. The semiconductor substrate 100 and the substrate pickup region 180 include impurities of the same first conductivity type. Meanwhile, the lightly doped pickup region 150 as illustrated in FIG. 3 may also be included in the second embodiment.

A heavily doped region 170 is disposed in the semiconductor substrate 100 between the gate spacer 160 and the device isolation layer 110. The heavily doped region 170 is surrounded by the horizontal lightly doped region 140. At this time, the heavily doped region and horizontal lightly doped region 170 and 140 include impurities of second conductivity type. Thus, the heavily doped region and horizontal lightly doped region 170 and 140 constitute a normal DDD structure and a PN junction in the semiconductor substrate 100.

A vertical lightly doped region 500, which surrounds the heavily doped region 170, is disposed in the semiconductor substrate 100 on a side of the gate electrode 130. At this time, the vertical lightly doped region 500 includes impurities of lower concentration than the heavily doped region 170 and higher than the horizontal lightly doped region 140. As is known to those skilled in the art, breakdown voltage diminishes as the concentration of the impurity region constituting a PN junction increases. Thus, in the case where high voltage sourced by an electrostatic discharge is transmitted to the heavily doped region 170, the breakdown phenomenon occurs at the vertical lightly doped region 500 earlier than at the horizontal lightly doped region 140.

In addition, the vertical lightly doped region 500, as illustrated in FIG. 3, surrounds the heavily doped region 170 and has a deeper diffusion depth than the horizontal lightly doped region 140. Accordingly, even if high-temperature heat caused by a breakdown is generated at an interface between the vertical lightly doped region 500 and the semiconductor substrate 100, the device is capable of delaying the propagation of the heat from the interface to an upper portion of the heavily doped region 170. Thus, degradation of product, which otherwise would be caused by the melting of the contact plug may be mitigated or eliminated, unlike the conventional approach. Also, the vertical lightly doped region 500, which has a deeper depth than the conventional junction region, increases the depth of the junction region connected to the input pin. Thus, when an electrostatic discharge occurs, a junction region capable of accumulating an inflow current is increased in this area, so as to improve electrostatic discharge protection characteristics of the resulting MOS transistor.

FIGS. 5A through 5D are cross-sectional views illustrating a method of fabricating the high-voltage transistor formed at the functioning circuit 20 of FIG. 1, according to the first embodiment of the present invention.

Referring to FIG. 5A, a vertical lightly doped region 500, a horizontal lightly doped region 140, and a lightly doped pickup region 150 are formed at a predetermined region of a semiconductor substrate 100 including impurities of first conductivity type. The impurity regions 500, 140, and 150 are preferably formed by separate ion implantation processes using mask patterns (not shown) that define the position of each region. At this time, the ion implantation processes are carried out, such that the lightly doped pickup region 150 includes impurities of a first conductivity type and the vertical and horizontal lightly doped regions 500 and 140 include impurities of a second conductivity type.

The lightly doped pickup region 150 is formed to have a higher impurity concentration than the semiconductor substrate 100. Also the vertical lightly doped region 500 is formed to have a higher impurity concentration than the horizontal lightly doped region 140. It is preferable that the ion implantation processes for forming the vertical and horizontal lightly doped regions 500 and 140 comprise implanting n-type impurity ions at a dose of $5.0 \times 10^{12}$ atoms/cm$^2$ and $4.5 \times 10^{12}$ atoms/cm$^2$, respectively.

A device isolation layer 110 is formed at a semiconductor substrate including the impurity regions 500, 140, and 150 to define an active region. An insulation pattern 111 is formed under an edge of a gate electrode to be formed during a subsequent process. Preferably, the insulation pattern 111 is formed at the same time as the device isolation layer 110. Also, the insulation pattern 111 is preferably formed on the horizontal lightly doped region 140.

It is preferable that the device isolation layer 110 is formed by a LOCOS process including thermally oxidizing a predetermined region of the semiconductor substrate 100. However, the device isolation layer 110 may optionally be formed by an ordinary trench technique. The impurity regions 500, 140, 150 are formed in consideration of a diffusion length of impurities resulting from the thermal oxidation for forming the device isolation layer 110.

In particular, the vertical lightly doped region 500 is preferably formed to have a depth that is greater than the horizontal lightly doped region 140. For this, the vertical lightly doped region 500 is preferably formed together while a well region (not shown) is formed at a predetermined region of the semiconductor substrate 100. In this case, as a mask (reticle) and additional process step for forming the vertical lightly doped region 500 are not required, the positive effects of the present invention can be obtained without increasing fabrication costs. To form the well region and the vertical lightly doped region 500, p-type impurities are implanted at an ion energy level of 1.2 MeV. Also, the vertical lightly doped region 500 may be formed after forming the device isolation layer 110.

Figure 5B:
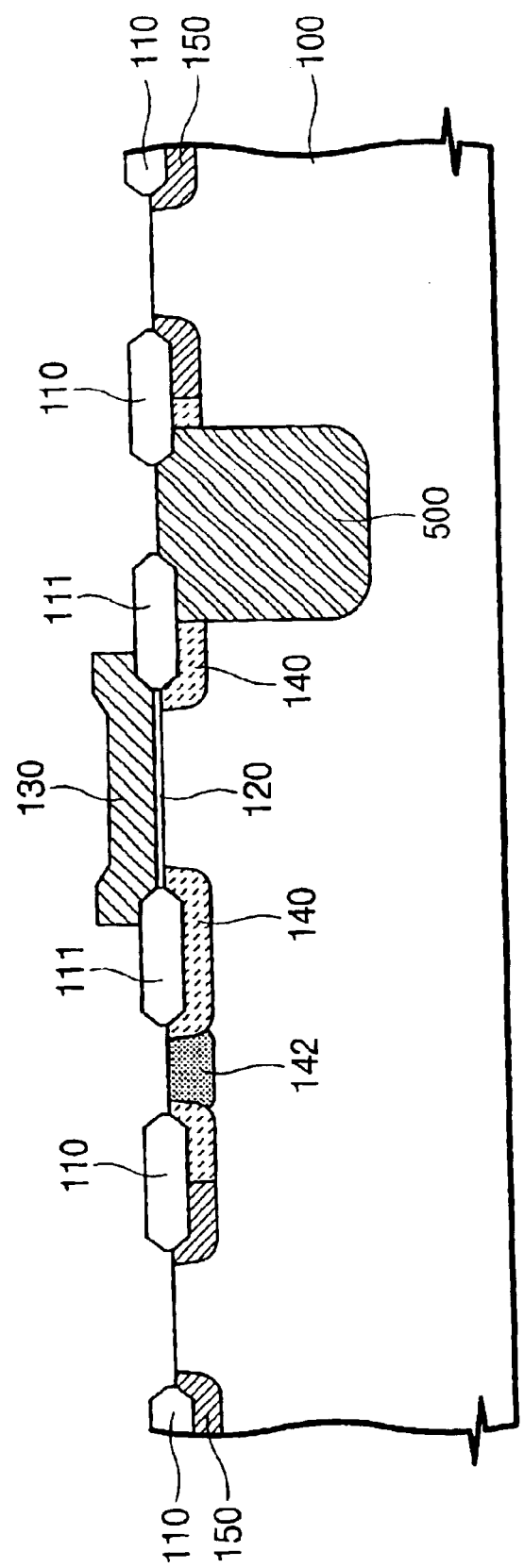

Referring to FIG. 5B, a gate insulation layer and a gate conductive layer are sequentially formed on the semiconductor substrate including the device isolation layer 110 and the insulation pattern 111. At this time, the gate insulation layer may be a silicon oxide layer obtained by the thermal oxidation while the gate conductive layer may be a polysilicon silicon layer. Thereafter, the gate conductive layer and the gate insulation layer are successively patterned to expose the semiconductor substrate 100, thereby forming a gate electrode 130 and a gate insulation pattern 120. The gate electrode 130 is formed to cover the edge of the insulation pattern 111 and the gate insulation pattern 120 between the insulation patterns 111. Meanwhile, the gate conductive layer may further comprise a metal layer, for example, tungsten silicide, and an anti-reflection layer for convenience in the patterning process of the polysilicon layer.

A photoresist pattern (not shown) is formed on the semiconductor substrate including the gate electrode 130. The photoresist pattern is formed to expose the active region disposed between the device isolation layer 110 and the insulation pattern 111. An ion implantation process is implemented using the photoresist pattern as an ion implantation mask, thereby forming a lower lightly doped region 142 of second conductivity type in the exposed active region. To form the lower lightly doped region 142, n-type impurities may be implanted at a dose of $8.0 \times 10^{12}$ atoms/m$^2$. Thus, the lower lightly doped region 142 includes a higher impurity concentration than the vertical and horizontal lightly doped regions 500 and 140. Thereafter, the photoresist pattern is removed.

Figure 5C:
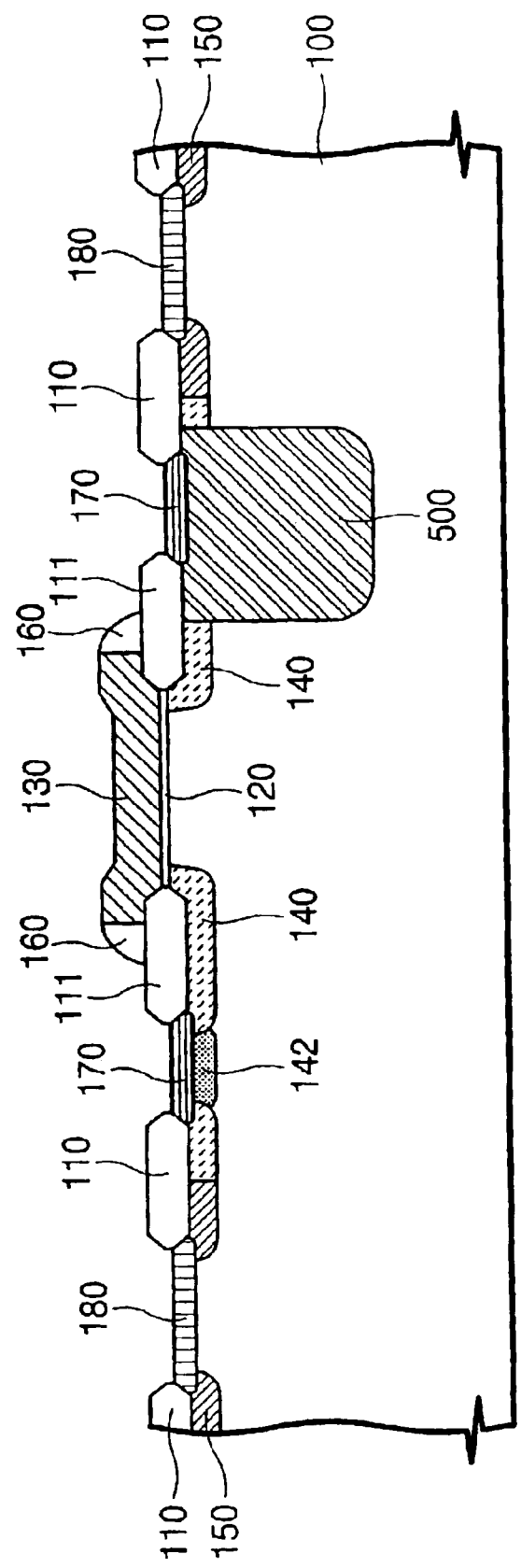

Referring to FIG. 5C, a gate spacer 160 is formed on sidewalls of the gate electrode 130. A heavily doped region 170 and a substrate pickup region 180 are formed on the semiconductor substrate including the gate spacer 160. The heavily doped region 170 and the substrate pickup region 180 are formed by separate ion implantation processes using different mask patterns.

The heavily doped region 170 is formed in the semiconductor substrate 100 between the device isolation layer 110 and the insulation pattern 111. Thus, the heavily doped region 170 is formed over the lower lightly doped region 142 and surrounded by the horizontal, vertical, and lower lightly doped regions 140, 500, and 142. Here, the heavily doped region 170 includes impurities of second conductivity type. For this, n-type impurities are preferably implanted at a dose of $5.0 \times 10^{14}$ atoms/m$^2$ so as to form the heavily doped region 170.

The substrate pickup region 180 comprises an impurity region for applying a voltage to the semiconductor substrate 100 and includes impurities of the same first conductivity type as the semiconductor substrate 100. Accordingly, the substrate pickup region 180 is formed in the semiconductor substrate 100 in the vicinity of the lightly doped regions 140 and 500, which include impurities of second conductivity type.

Figure 5D:
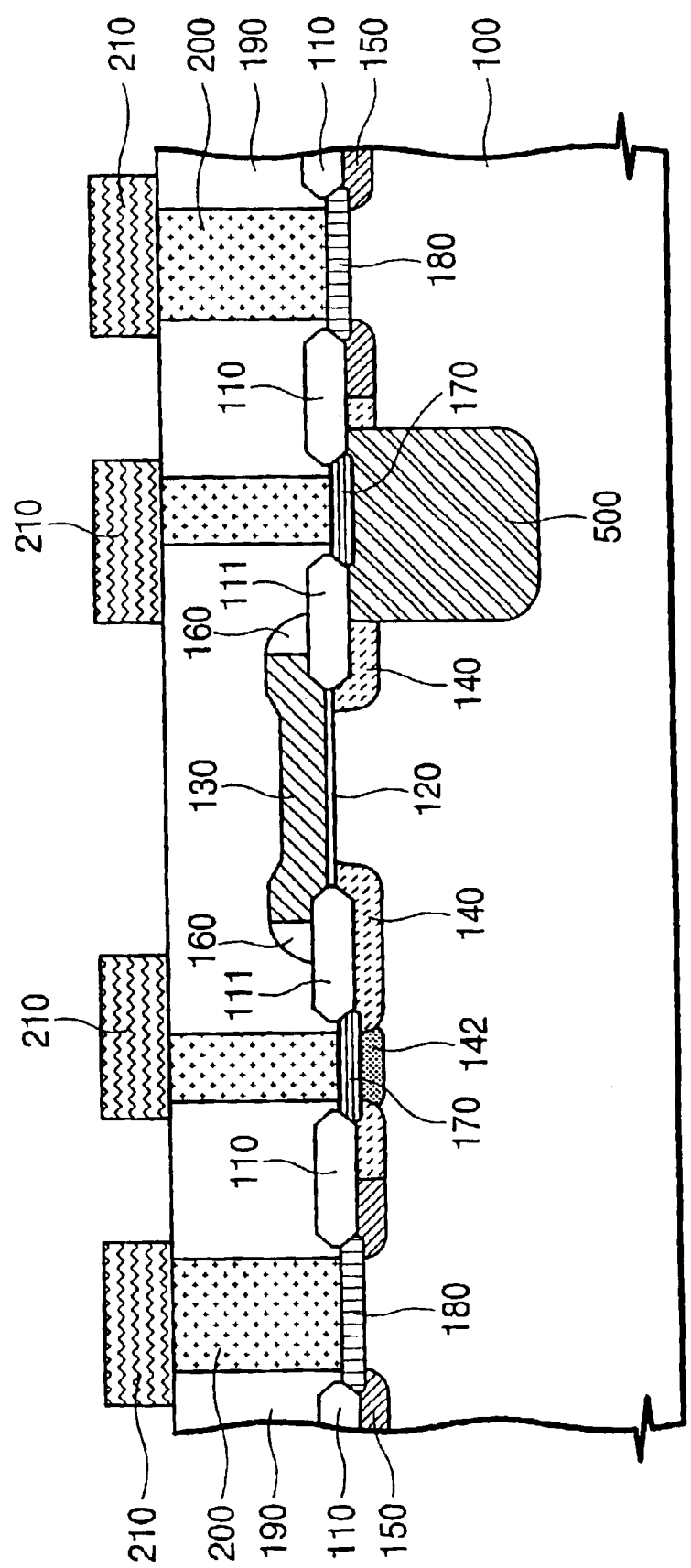

Referring to FIG. 5D, an interlayer dielectric (ILD) is formed on the entire surface of the semiconductor substrate including the heavily doped region 170 and the substrate pickup region 180. The ILD 190 is patterned to form openings, which expose the heavily doped region 170 and the substrate pickup region 180. Contact plugs 200 are formed to fill the opening. The contact plugs 200 are preferably formed of metal such as aluminum and tungsten. Next, interconnections 210, which contact a top surface of the contact plug 200, are formed on the ILD 190. The vertical lightly doped region 500 is connected to an input pin via the contact plug 200 and the interconnections 210.

In the first embodiment, the insulation pattern 111 spaces apart the gate electrode 130 from the heavily doped region 170 to allow for a higher breakdown voltage between the gate and source/drain. Meanwhile, the present invention may be applied to semiconductor devices having a junction region without the insulation pattern 111, which is normally used to allow for high integration in semiconductor devices.

FIGS. 6A through 6D are cross-sectional views illustrating a method of fabricating the high-voltage transistor formed at a functioning circuit, for example the functioning circuit of FIG. 1, according to the second preferred embodiment of the present invention. In the second preferred embodiment, the insulation pattern 111 will be not formed, as compared with the first preferred embodiment.

Referring to FIGS. 6A through 6D, the insulation pattern 111 is not formed during the formation process of the device isolation layer 110 or subsequent processes. Also, the second embodiment may not include forming the lower lightly doped region 142 described in the first embodiment. Further, forming the horizontal lightly doped region 140 may be performed between the steps of forming the device isolation layer 110 and the gate insulation layer.

As a result, a semiconductor device according to the second embodiment of the present invention comprises a transistor including a source of an ordinary double diffused drain (DDD) structure and a drain of a DDD structure further having the vertical lightly doped region 500.

Figure 6B:
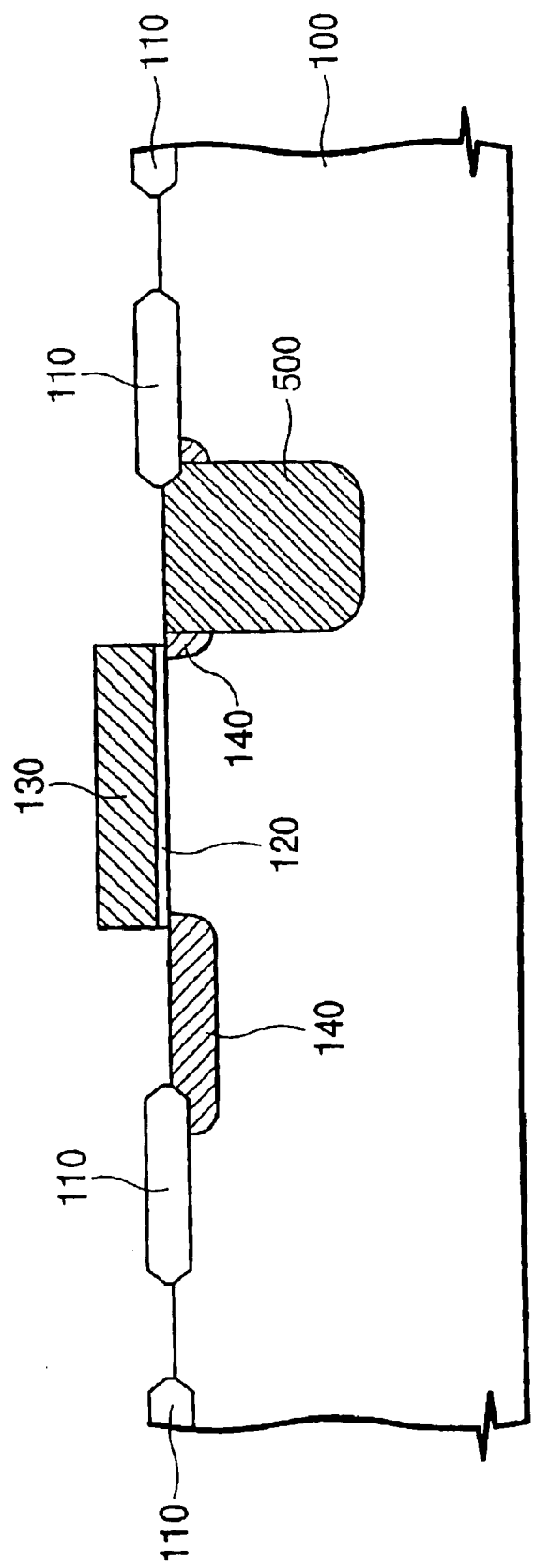

The second embodiment is the same as the first embodiment except that the steps of forming the horizontal lightly doped region 140 are changed and the insulation pattern 111 and the lower lightly doped region 142 are not formed. Thus, the second embodiment as shown in FIGS. 6A and 6B may be readily formed according to the method explained in the first embodiment, or simply transformed methods thereof. The remaining steps illustrated in FIGS. 6B, 6C, and 6D correspond to the steps of 5B, 5C, and 5D respectively. Description of repeated steps will therefore be omitted here for brevity.

Meanwhile, in the first and second embodiments, formation of the vertical lightly doped region 500 is preferably followed by formation of the gate electrode 130. However, the vertical lightly doped region 500 may be formed following formation of the gate electrode 130 or the heavily doped region 170.

FIG. 7 is an experimental graph showing comparisons in ESD level characteristics between the conventional semiconductor device and the semiconductor device according to the first and second preferred embodiments of the present invention.

Referring to FIG. 7, the experiment was carried out on the semiconductor devices having structures as shown in FIGS. 2 and 3, respectively. The experimental method was based on a typical ESD level measurement method (MIL-STD 3015.6).

In the semiconductor device of the present invention, the vertical lightly doped region 500 was formed using an ion implantation process for forming the well region, which is described in FIG. 5A. At this time, the vertical lightly doped regions 500 were classified into two groups according to a distance spaced apart from the sidewall of the heavily doped region 170. One group (a) has a distance of 0.1 $\mu$m, and the other (b) has a distance of 1.5 $\mu$m. In the case of the group (a), measurements of ESL level were 2700V, 4700V, and 4700V. In the case of the group (b), measurements of ESL level were 5000V, 5000V, and 6000V. By comparison, in the conventional semiconductor device, ESL level was 600 V to 2600V. According to the present invention, semiconductor devices exhibited an improvement in ESD characteristics as compared with devices formed according to the conventional method.

The semiconductor device of the present invention includes a vertical lightly doped region that increases a depth of a junction region connected to an input pin. This leads to an increase in the distance between an interface of the junction region and a contact plug, while increasing the area of the junction region. As a result, melting of the contact plug may be mitigated or eliminated and capacity for accumulating current caused by an electrostatic discharge may be increased. Accordingly, semiconductor devices having an improved ESD characteristic may be fabricated.

While this invention has been particularly described with reference to preferred embodiments thereof, it will be understood by those skilled in the art that various changes in form and details may be made herein without departing from the spirit and scope of the invention as defined by the appended claims.

What is claimed is:

1. A semiconductor device comprising:

a gate electrode disposed on a semiconductor substrate of a first conductivity type;

heavily doped regions of a second conductivity type formed in the semiconductor substrate at a side of the gate electrode, each of the heavily doped regions having a first lateral edge, a second lateral edge, and a lower edge, and a vertical lightly doped asymmetric region formed in the semiconductor substrate, the vertical lightly doped asymmetric region surrounding the first and second lateral edges and the lower edge of a corresponding one of the heavily doped regions, wherein the vertical lightly doped asymmetric region has a lower impurity concentration and a deeper depth than the corresponding heavily doped region.

2. The device as claimed in claim 1, further comprising a horizontal lightly doped region of the second conductivity type disposed in an upper portion of the vertical lightly doped asymmetric region.

3. The device as claimed in claim 2, wherein the horizontal lightly doped region has a lower impurity concentration than the vertical lightly doped asymmetric region.

4. The device as claimed in claim 1, further comprising a gate insulation pattern between the gate electrode and the semiconductor substrate.

5. The device as claimed in claim 1, further comprising an insulation pattern between the heavily doped regions and corresponding edges of the gate electrode.

6. The device as claimed in claim 1, wherein the vertical lightly doped asymmetric region is connected to an input pin where a high voltage according to an electrostatic discharge is applied.

7. The device as claimed in claim 1, wherein the vertical lightly doped asymmetric region has a width that is greater than a width of the corresponding heavily doped region.

8. A method for fabricating a semiconductor device comprising:

forming a gate electrode on a semiconductor substrate of a first conductivity type;

forming a heavily doped region of a second conductivity type in the semiconductor substrate beside the gate electrode, the heavily doped region having a first lateral edge, a second lateral edge, and a lower edge; and forming a vertical lightly doped asymmetric region of the second conductivity type surrounding the first and second lateral edges and the lower edge of the heavily doped region in the semiconductor substrate, wherein the vertical lightly doped asymmetric region has a lower impurity concentration and a larger depth than the heavily doped region.

9. The method as claimed in claim 8, wherein the vertical lightly doped asymmetric region is formed before forming the gate electrode.

10. The method as claimed in claim 8, wherein forming the gate electrode comprises:

sequentially forming a gate insulation layer and a gate conductive layer on the semiconductor substrate; and successively patterning the gate conductive layer and the gate insulation layer until the semiconductor substrate is exposed, to form a gate electrode and a gate insulation pattern.

11. The method as claimed in claim 8, wherein forming the heavily doped region comprises:

forming a gate spacer on sidewalls of the gate electrode; and implementing an ion implantation process by using the gate spacer as an ion implantation mask.

12. The method as claimed in claim 8, wherein before forming the gate electrode, further comprising forming a horizontal lightly doped region disposed on upper sidewalls of the vertical lightly doped asymmetric region and including impurities of the second conductivity type.

13. The method as claimed in claim 12, wherein the horizontal lightly doped region is formed to have a lower impurity concentration than the vertical lightly doped asymmetric region.

14. The method as claimed in claim 8, wherein, before forming the gate electrode, further comprising performing a device isolation step for forming a device isolation layer to define an active region of the semiconductor substrate.

15. The method as claimed in claim 14, wherein the device isolation is carried out to dispose an insulation pattern between an edge of the gate electrode and the heavily doped region.

16. The method as claimed in claim 14, wherein, before forming the device isolation layer, further comprising forming a horizontal lightly doped region disposed on upper sidewalls of the vertical lightly doped asymmetric region and including impurities of the second conductivity type.

17. The method as claimed in claim 16, wherein the horizontal lightly doped region is formed to have a lower impurity concentration than the vertical lightly doped asymmetric region.

* * * * *